United States Patent [19]

Inada et al.

[11] Patent Number: 5,424,722
[45] Date of Patent: Jun. 13, 1995

[54] DEVICE FOR DISPLAYING REMAINING ELECTRIC ENERGY OF BATTERY

[75] Inventors: Mitsuharu Inada; Norio Ohga, both of Tokyo; Takashi Tomida, Saitama, all of Japan

[73] Assignee: Sony Corporation, Japan

[21] Appl. No.: 161,457

[22] Filed: Dec. 6, 1993

Related U.S. Application Data

[63] Continuation of Ser. No. 873,118, Apr. 24, 1992, abandoned.

[30] Foreign Application Priority Data

May 13, 1991 [JP] Japan .................. 3-137173

[51] Int. Cl.⁶ .............................................. G08B 21/00
[52] U.S. Cl. ...................................... 340/636; 324/426; 324/433; 320/48
[58] Field of Search ............... 340/636; 324/426, 427, 324/432, 433; 320/48

[56] References Cited

U.S. PATENT DOCUMENTS

| | | | |
|---|---|---|---|
| 4,163,935 | 8/1979 | Sakurada et al. | 324/29.5 |
| 4,306,294 | 12/1981 | Hashimoto et al. | 364/705 |
| 4,544,893 | 10/1985 | Takahashi | 340/636 |
| 4,626,765 | 2/1986 | Tanaka | 340/636 |
| 4,800,336 | 1/1989 | Mikami | 324/426 |
| 4,866,389 | 9/1989 | Ryan et al. | 340/636 |
| 5,032,825 | 7/1991 | Kuznicki | 340/636 |
| 5,065,084 | 11/1991 | Oogita | 340/636 |
| 5,099,209 | 3/1992 | Seki et al. | 340/428 |
| 5,124,627 | 6/1992 | Okada | 340/636 |
| 5,126,675 | 6/1992 | Yang | 324/427 |
| 5,130,659 | 7/1992 | Sloan | 340/636 |
| 5,136,246 | 8/1992 | Sakamoto | 324/433 |
| 5,140,310 | 8/1992 | DeLuca et al. | 340/636 |
| 5,142,233 | 8/1992 | Serita | 340/636 |
| 5,151,865 | 9/1992 | Blessing et al. | 324/427 |
| 5,166,623 | 11/1992 | Ganio | 340/636 |
| 5,191,291 | 3/1993 | Taylor | 340/636 |

FOREIGN PATENT DOCUMENTS

| | | |
|---|---|---|
| 3100503 | 8/1982 | Germany . |
| 61-231472 | 10/1986 | Japan . |
| 2190755 | 11/1987 | United Kingdom . |

OTHER PUBLICATIONS

Patent Abstracts of Japan, vol. 8, No. 213, Sep. 28, 1984.
Patemt Abstracts of Japan, vol. 11, No. 68, Feb. 28, 1987.

*Primary Examiner*—John K. Peng
*Assistant Examiner*—Edward Lefkowitz
*Attorney, Agent, or Firm*—Ronald P. Kananen

[57] ABSTRACT

A display device has a time-constant circuit and a switching element such as a transistor for supplying the voltage of a battery to the time-constant circuit when a battery check key is pressed. A microcomputer measures a time interval from a time when the voltage of the battery starts being supplied to the time-constant circuit to a time when a voltage of the time-constant circuit reaches a predetermined value, and determines the remaining electric energy of the battery from the measured time interval. The microcomputer supplies data to a display unit which then displays a progressively variable display mark combination representative of the determined remaining electric energy of the battery.

22 Claims, 6 Drawing Sheets

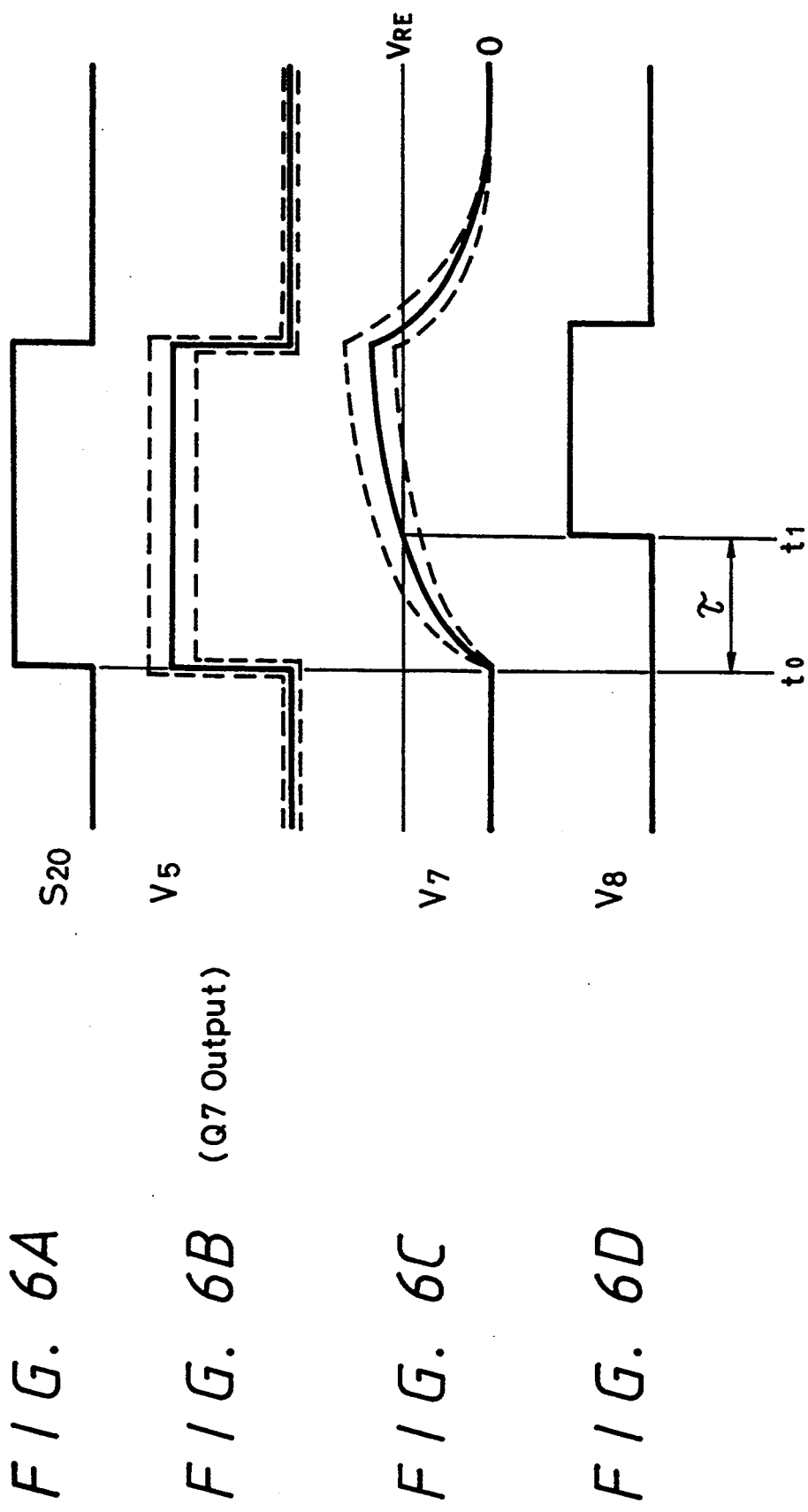

DEVICE FOR DISPLAYING REMAINING ELECTRIC ENERGY OF BATTERY

This application is a continuation of parent application Ser. No. 07/873,118 filed Apr. 24, 1992, now abandoned.

BACKGROUND OF THE INVENTION

Field of the Invention

The present invention relates to a device for displaying the remaining electric energy of a battery for use with a phase-locked loop (PLL) radio receiver, for example.

Description of the Prior Art

Some radio receivers have tuner circuits which incorporate variable capacitors. When batteries used as power supplies in such radio receivers are consumed, or their voltage drops, sounds reproduced by the radio receivers are distorted. Transmitted signals can be reproduced normally when the consumed batteries are replaced with new batteries.

However, when batteries used as power supplies in radio receivers with PLL synthesizers are consumed, data items stored in a memory with respect to selected frequencies to be received are changed or destructed. Therefore, transmitted signals cannot be received properly because the stored data items are changed or destructed simply by replacing the consumed batteries with new batteries.

Usually, battery-powered radio receivers are equipped with a display circuit for displaying a warning when the battery voltage drops to a level which adversely affects the memory of the radio receiver.

FIG. 1 of the accompanying drawings shows a conventional display device for displaying such a warning. A radio receiver 10 has a PLL synthesizer with a PLL 11 and a loudspeaker 12. The PLL 11 includes a variable frequency divider (not shown) whose frequency dividing ratio N may be varied to select the broadcast of a frequency corresponding to the frequency dividing ratio N.

The frequency dividing ratio N is controlled by a microcomputer 20 having a memory 21 for storing data relative to frequencies to be received, e.g., frequency dividing ratios N corresponding to those frequencies to be received. To the microcomputer 20, there is connected a LCD (liquid crystal display) 3 for digitally displaying a frequency being received, and a plurality of control keys 4 for indicating a desired frequency.

When the control keys 4 are operated on to indicate a frequency, the microcomputer 20 reads a corresponding frequency dividing ratio N from the memory 21, and sets the variable frequency divider in the PLL 11 to the frequency dividing ratio N read from the memory 21 for selecting the desired frequency.

A battery 5 of 3 V, for example, used as a power supply applies a voltage V5 to a power supply terminal VDD of the microcomputer 20. A switching transistor Q1 is connected between the battery 5 and a power supply terminal VDD of the radio receiver 10. The transistor Q1 has a base supplied with a control signal from the microcomputer 20.

A voltage detector 6 serves to detect the voltage V5 from the battery 5, and applies a detected output V6 to a chip-enable terminal CE of the microcomputer 20. When the voltage V5 of the battery 5 is equal to or higher than a threshold value VTH, e.g., 67% of an initial voltage Vinit, the detected output V6 is "1", and when the voltage V5 is lower than the threshold value VTH, the detected output V6 is "0". The voltage detector 6 comprises a one-chip CI dedicated for voltage detection. A pull-up resistor R1 is connected between the power supply terminal VDD of the microcomputer 20 and the chip-enable terminal CE. A backup capacitor 9 is connected across the battery 5, so that it is normally charged by the battery 5. In the event that the battery 5 is replaced with a new battery, the backup capacitor 9 provides the voltage V5 for a short period of time to protect the data stored in the memory 21 during the replacement of the battery 5.

If the voltage V5 of the battery 5 is of a sufficiently high level, i.e., a level higher than the threshold value VTH, then the detected output V6 is "1". Under this condition, a power supply key of the control keys 4 is turned on, the microcomputer 20 turns on the transistor Q1. The voltage V5 is now applied through the transistor Q1 as an operating voltage to the radio receiver 10 to enable the radio receiver 10 to receive a broadcast whose frequency has been selected by the control keys 4 as described above.

If the voltage V5 of the battery 5 drops below the threshold value VTH, then the detected output V6 becomes "0". At this time, the microcomputer 20 is no longer capable of accepting input signals from the control keys 4. The microcomputer 20 also turns off the transistor Q1, so that the voltage V5 is not supplied from the battery 5 to the radio receiver 10. The microcomputer 20 controls the LCD 3 to display a blinking mark indicating the voltage drop of the battery 5 or demanding a battery replacement, e.g., a mark indicating that the battery is used up, as shown in FIG. 2 of the accompanying drawings.

At this time, the voltage of the battery 5 is of a minimum level required to keep the microcomputer 20 energized for thereby protecting the frequency dividing ratios N stored in the memory 21 from changes or destruction.

With the display device shown in FIG. 1, therefore, when the voltage V5 of the battery 5 drops below the threshold value VTH, the radio receiver 10 is forcibly de-energized, the remaining voltage of the battery 5 is used to keep the frequency dividing ratios N stored in the memory 21, and the voltage drop of the battery 5 is displayed by the LCD 3.

However, the user is notified of the voltage drop by the LCD 3 for the first time when the voltage V5 of the battery 5 drops below the threshold value VTH. Inasmuch as the user cannot predict the time to replace the battery 5 before the voltage drop of the battery 5 is displayed by the LCD 3, the user is often unable to have a new battery ready for immediate replacement of the consumed battery 5. As a result, in the event of the voltage drop of the battery 5, the user may not change frequencies to be received by the radio receiver 10.

OBJECTS AND SUMMARY OF THE INVENTION

It is an object of the present invention to provide a device for displaying progressively varying stepwise levels of the remaining electric energy or voltage that is available from a battery.

According to the present invention, there is provided a display device for displaying the remaining electric energy of a battery in an electronic device having a memory for storing predetermined data, the display device comprising a time-constant circuit, switching means for supplying a voltage of the battery to the time-constant circuit in response to a key stroke, control means for measuring a time interval from a time when the voltage of the battery starts being supplied to the time-constant circuit to a time when a voltage of the time-constant circuit reaches a predetermined value, and for determining the remaining electric energy of the battery from the measured time interval, and display means for displaying a progressively variable display mark combination representative of the determined remaining electric energy of the battery.

The display means comprises common display elements for selectively displaying the data stored in the memory and the progressively variable display mark combination representative of the determined remaining electric energy of the battery. The progressively variable display mark combination comprises a plurality of display marks selectively energizable depending on the remaining electric energy of the battery which is determined by the control means.

The time interval until the time when the voltage of the time-constant circuit reaches the predetermined value varies depending on the remaining electric energy or voltage of the battery. The remaining electric energy of the battery is determined from the time interval, and displayed as the progressively variable display mark combination by the display means.

The above and other objects, features, and advantages of the present invention will become apparent from the following description of illustrative embodiments thereof to be read in conjunction with the accompanying drawings, in which like reference numerals represent the same or similar objects.

BRIEF DESCRIPTION OF THE DRAWINGS

FIGS. 6A through 6D are diagrams of the waveforms of signals in the display device according to the present invention;

DETAILED DESCRIPTION OF THE PREFERRED EMBODIMENTS

Figure 3:
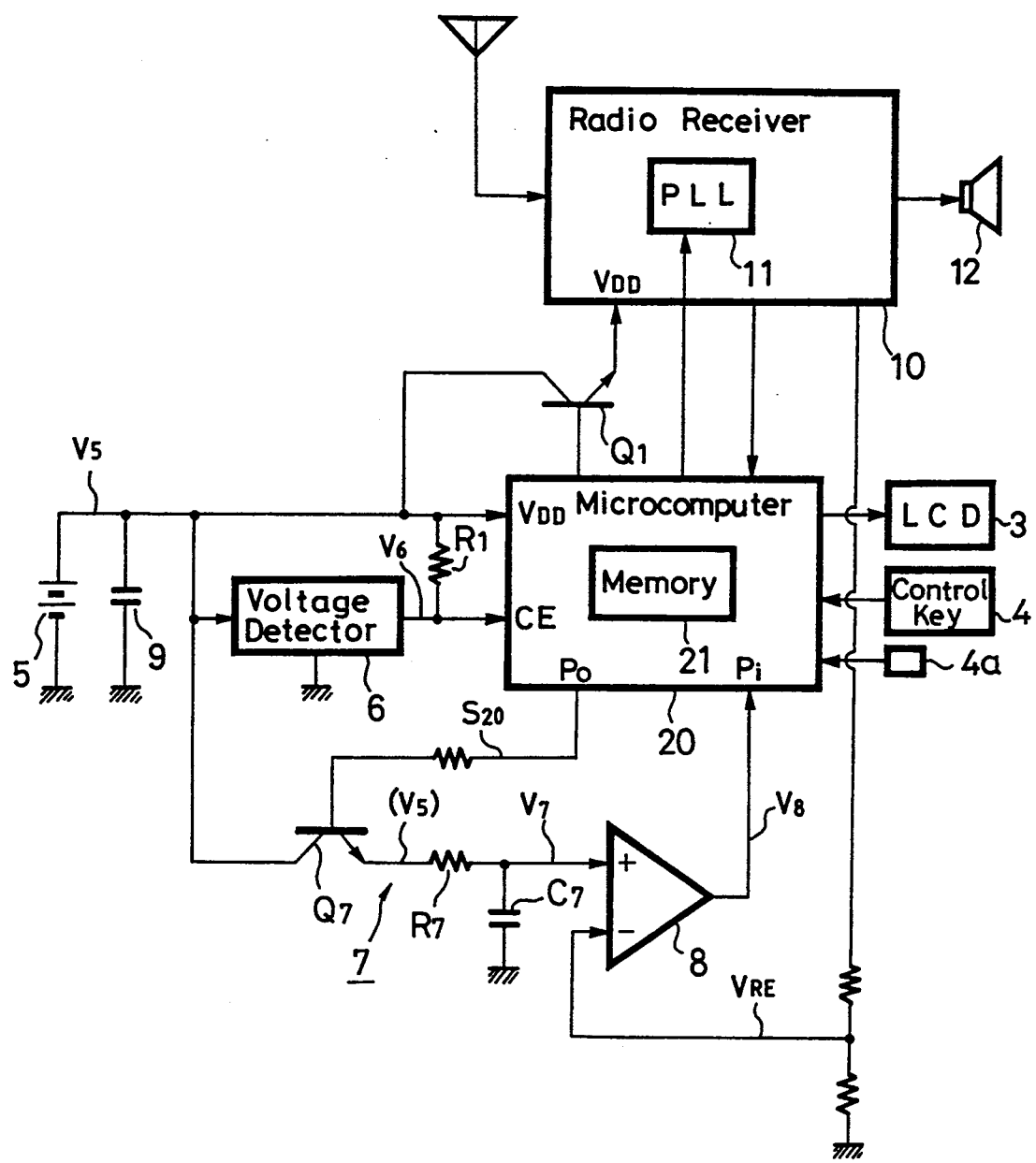
FIG. 3 is a circuit diagram, partly in block form, of a display device according to the present invention.

FIG. 3 shows a battery voltage display device according to the present invention. As shown in FIG. 3, a radio receiver 10 with a PLL 11, a loudspeaker 12, a microcomputer 20 having a memory 21, an LCD 3, a plurality of control keys 4, a battery 5, a switching transistor Q1, a voltage detector 6, a pull-up resistor R1, and a backup capacitor 9 are identical structurally and functionally to those shown in FIG. 1, and will not be described in detail below.

A time-constant circuit 7 comprises a resistor R7 and a capacitor C7. The resistor R7, which is an input terminal of the time-constant circuit 7, is connected through a transistor Q7 to the battery 5. The transistor Q7 has a base supplied with a control signal S20 from an output port Po of the microcomputer 20.

The time-constant circuit 7 applies an output voltage V7 from the capacitor C7 to a voltage comparator 8, which is supplied with a reference voltage VRE that is derived from a constant voltage produced by a constant-voltage circuit (not shown) of the radio receiver 10. The voltage comparator 8 applies a comparison output V8 to an input port Pi of the microcomputer 20.

Figure 4:
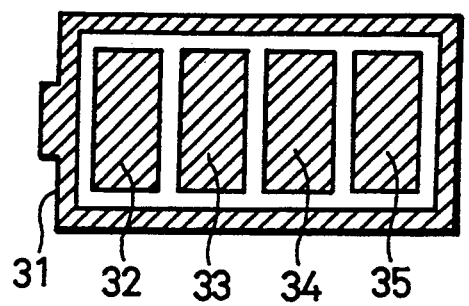
FIG. 4 is a view showing a display unit.

The LCD 3 has a display unit or mark 30 (see FIG. 4) as indicating the remaining voltage of the battery 5. As shown in FIG. 4, the display mark 30 comprises a plurality of display elements 31, 32, 33, 34, 35. The display element 31 is in the shape of an elongate rectangular frame representing the profile of a general battery, and includes a projection on one end, indicating the positive terminal of the battery. The display elements 32~35 are each of an elongate rectangular shape, and are positioned closely within the display element 31. In the LCD 3, the display elements 31 35 actually comprise transparent electrodes for driving the liquid crystal of the LCD 3.

A battery check key 4a, in addition to the control keys 4, is also connected to the microcomputer 20.

When the battery check key 4a is pressed at a time t0 (see FIGS. 6A through 6D), the control signal S20 from the microcomputer 20 becomes "1" for a predetermined period of time from the time t0 (see FIG. 6A), turning on the transistor Q7 from the time to on. As indicated by the solid-line curve in FIG. 6B, the voltage V5 of the battery 5 is supplied through the transistor Q7 to the time-constant circuit 7 from the time t0 on. Therefore, the output voltage V7 across the capacitor C7 gradually increases from the time t0 on, as shown in FIG. 6C.

The voltage comparator 8 compares the voltage V7 with the reference voltage VRE. When the voltage V7 is equal to or higher than the reference voltage VRE at a time t1, as shown in FIG. 6D, the voltage comparator 8 supplies a comparison output V8 of "1" to the input port Pi of the microcomputer 20.

The magnitude of the voltage V5 of the battery 5 varies with the remaining electric energy of the battery 5 as indicated by the solid- and broken-line curves in FIG. 6B. Therefore, the rate of change of the voltage V7 across the capacitor C7 also varies with the remaining electric energy of the battery 5. The higher the voltage V5, i.e., the greater the remaining electric energy of the battery 5, the higher the rate at which the voltage V7 increases. Thus, as the remaining electric energy of the battery 5 is greater, the time t1 of the positive-going edge of the voltage V8 is earlier, i.e., closer to the time t0, with the time interval $\tau$ between the times t0, t1 being shorter.

The time interval $\tau$ has different values $\tau1 \sim \tau4$ 41 44 for different values of the voltage V5 of the battery 5, as follows:

1. When the voltage V5 is 90% of the initial voltage Vinit of the battery 5, the time interval $\tau$ has a value 1.
2. When the voltage V5 is 85% of the initial voltage Vinit of the battery 5, the time interval $\tau$ has a value $\tau2$.
3. When the voltage V5 is 80% of the initial voltage Vinit of the battery 5, the time interval has a value $\tau3$.

4. When the voltage V5 is 67% of the initial voltage Vinit of the battery 5, the time interval $\tau$ has a value $\tau 4$.

The microcomputer 20 measures the time interval $\tau$, and determines the remaining electric energy or voltage of the battery 5 based on the measured time interval $\tau$. Then, the microcomputer 20 drives or energizes the display elements 31~35 of the display mark 30, as follows:

(1) When $\tau \leq \tau 1$, the microcomputer 20 energizes the display elements 31~35.
(2) When $\tau 1 < \tau \leq \tau 2$, the microcomputer 20 energizes the display elements 31, 33~35.
(3) When $\tau 2 < \tau \leq \tau 3$, the microcomputer 20 energizes the display elements 31, 34, 35.
(4) When $\tau 3 < \tau \leq \tau 4$, the microcomputer 20 energizes the display elements 31, 35.
(5) When $\tau 4 \leq \tau$, the microcomputer 20 energizes the display element 31 so that it blinks.

Figure 5A:
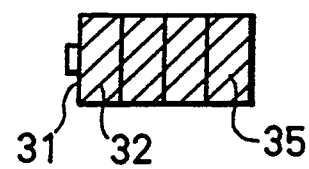
FIGS. 5A through 5E are views showing different battery voltage display conditions of the display unit.

Consequently, when the voltage V5 of the battery 5 is equal to or higher than 90% of the initial voltage Vinit (i.e., in the case (1) above), all the display elements 31~35 of the display mark 30 are energized, as shown in FIG. 5A.

Figure 5B:
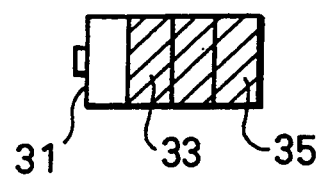

When the voltage V5 of the battery 5 is in the range between 90% and 85% of the initial voltage Vinit (i.e., in the case (2) above), the display elements 31, 33~35 of the display mark 30 are energized, as shown in FIG. 5B.

Figure 5C:
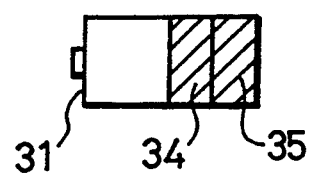

When the voltage V5 of the battery 5 is in the range between 85% and 80% of the initial voltage Vinit (i.e., in the case (3) above), the display elements 31, 34, 35 of the display mark 30 are energized, as shown in FIG. 5C.

Figure 5D:
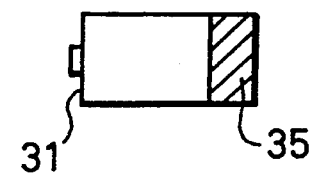

When the voltage V5 of the battery 5 is in the range between 80% and 67% of the initial voltage Vinit (i.e., the case (4)), the display elements 31, 35 of the display mark 30 are energized, as shown in FIG. 5D.

Figure 5E:
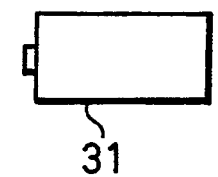

When the voltage V5 of the battery 5 is lower than 67% of the initial voltage Vinit (i.e., the case (5)), the display element 31 of the display mark 30 is energized so that it blinks, as shown in FIG. 5E. At this time, the detected output V6 from the voltage detector 6 is "0". Thus, the microcomputer 20 turns off the transistor Q1, preventing the voltage V5 of the battery 5 from being applied to the radio receiver 10, and does not accept any input signals from the control keys 4.

As described above, the voltage V5 of the battery 5 is supplied to the time-constant circuit 7, and the remaining electric energy of the battery 5 is determined from the time interval $\tau$ that is required for the voltage V7 across the capacitor C7 to reach the reference voltage VRE, and is also displayed as a progressively varying stepwise mark on the LCD 3. Accordingly, the user is able to know the rate at which the remaining electric energy of the battery 5 decreases, and to have a new battery ready for replacement based on the displayed rate of decrease of the remaining electric energy of the battery 5. The battery voltage display device according to the present invention is thus highly advantageous when incorporated in a circuit that requires frequent battery replacement, such as a small-size portable radio receiver which may be carried everyday and used on commuter trains, for example, by the user.

When the ambient temperature is low, the electric energy stored in the battery 5 is also reduced. The battery voltage display device according to the present invention is also capable of displaying such a temperature-dependent reduction in the voltage V5 of the battery 5.

Figure 1:
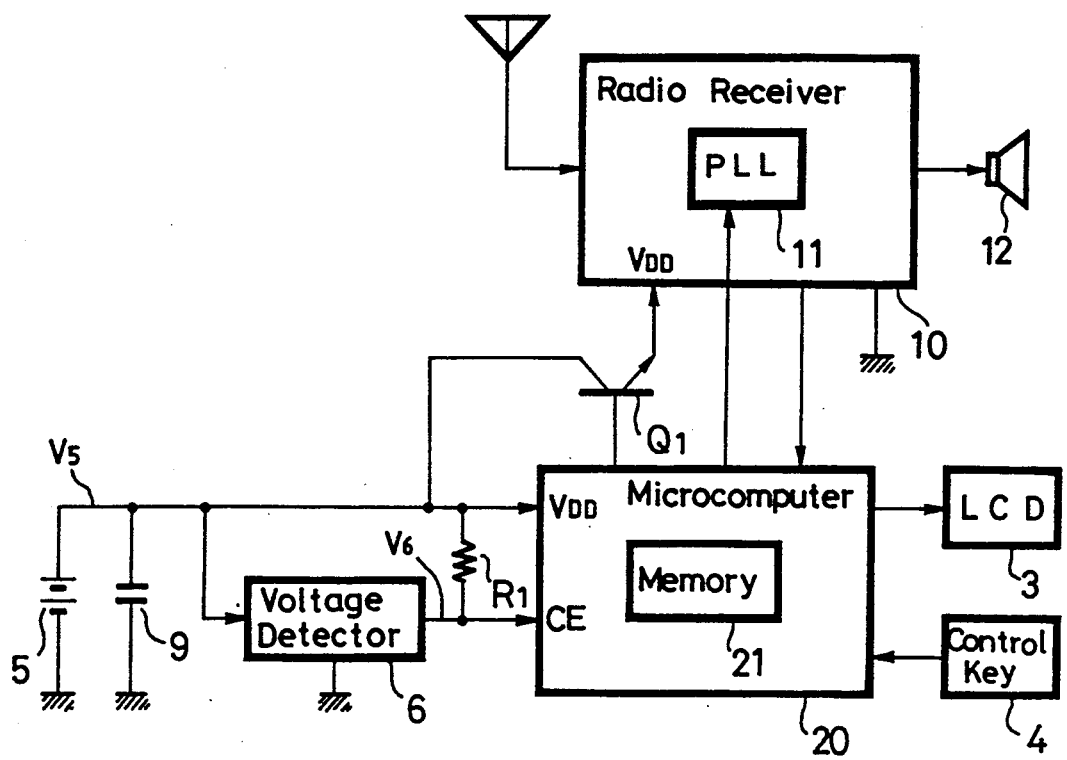
FIG. 1 is a circuit diagram, partly in block form, of a conventional display device.
Figure 2:
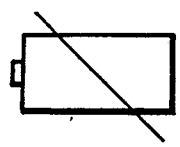
FIG. 2 is a view showing a mark displayed by the display device shown in FIG. 1.

Another advantage of the battery voltage display device according to the present invention is that the cost thereof is not much higher than the conventional battery voltage display device shown in FIG. 1 because an additional circuit arrangement included in the circuit shown in FIG. 3 is relatively simple.

Figure 7A:
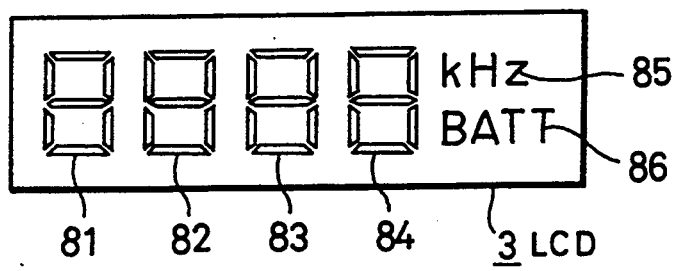
FIGS. 7A through 7G are views showing a display unit and different display conditions thereof.
Figure 7B:
Figure 7C:
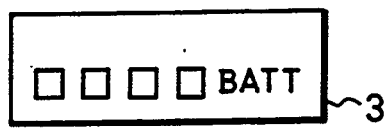
Figure 7D:
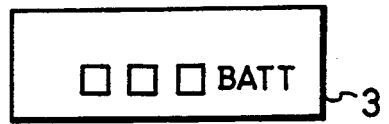
Figure 7E:
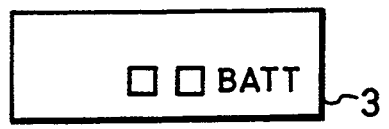
Figure 7F:
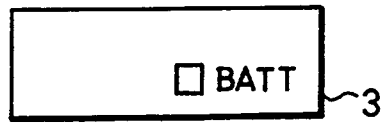
Figure 7G:

In the above embodiment, the display mark 30 for indicating the remaining electric energy of the battery 5 is independently displayed on the LCD 3. However, the display unit of the LCD 3 for displaying received radio frequencies may also be used to display the voltage of the battery 5. For example, as shown in FIG. 7A, the LCD 3 has a display mark 81 composed of seven display segments arranged in the pattern of "8" and also similar display marks 82, 83, 84. The LCD 3 additionally has a display mark 85 for displaying the unit "kHz" of received radio frequencies, and a display mark 86 for displaying the indicia "BATT" meaning a battery.

While the radio receiver 10 is receiving a broadcast, the frequency thereof is digitally displayed by the display marks 81~85. When the battery check key 4a is pressed, the lower four display segments of each of the display marks 81~84 and the display mark 86 are selectively energized or blinked depending on the remaining electric energy of the battery 5, thus displaying the remaining electric energy or voltage of the battery 5.

Figure 8:
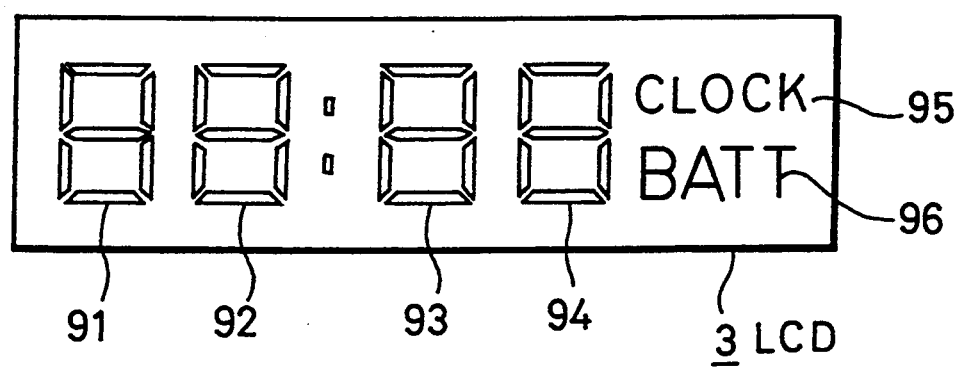
FIG. 8 is a view showing another display unit.

The battery voltage display device has been described as being incorporated in a radio receiver. However, the principles of the present invention are also applicable to other electronic devices. FIG. 8 shows a display unit for use on a clock with a program timer. The display unit or LCD 3 has a plurality of display marks 91, 92, 93, 94 each composed of seven display segments arranged in the pattern of "8", the display marks 91, 92 displaying hours and the display marks 93, 94 displaying minutes. The LCD 3 additionally has a display mark 95 for displaying the indicia "CLOCK", and a display mark 96 for displaying the indicia "BATT" meaning a battery. The display marks 91~94 therefore display time. When a battery check key on the clock is pressed, the lower four display segments of each of the display marks 91~94 and the display mark 96 are selectively energized or blinked depending on the remaining electric energy of the battery of the clock, thus displaying the remaining electric energy or voltage of the battery.

In the display units shown in FIGS. 7A through 7G and 8, no new display elements need to be added to the LCD 3 for the display of the remaining electric energy of the battery 5. Therefore, the display area of the LCD 3 is made relatively small, and the number of signal lines interconnecting the microcomputer 20 and the LCD 3 is not increased.

Having described preferred embodiments of the invention with reference to the accompanying drawings, it is to be understood that the invention is not limited to that precise embodiments and that various changes and modifications could be effected by one skilled in the art without departing from the spirit or scope of the invention as defined in the appended claims.

What is claimed is:

1. A display device for displaying the remaining electric energy of a battery in an electronic device having a memory for storing predetermined data, said display device comprising:

a time-constant circuit including a resistor and a capacitor, said time-constant circuit providing an output voltage from a juncture of said resistor and said capacitor;

switching means for supplying a voltage of the battery to said time-constant circuit in response to a key stroke;

voltage comparison means for comparing said output voltage of said time-constant circuit with a reference voltage;

control means for measuring a time interval from a time when the voltage of the battery starts being supplied to said time-constant circuit to a time when said output voltage of said time-constant circuit reaches a predetermined value, and for determining the remaining electric energy of the battery from the measured time interval; and display means having a common display area for selectively displaying information corresponding to the predetermined data and both in response to said key stroke, a progressively variable display mark combination representative of the determined remaining electric energy of the battery.

2. A display device according to claim 1, wherein said display means comprises common display elements for selectively displaying the data stored in the memory and for selectively displaying the progressively variable display mark combination representative of the determined remaining electric energy of the battery.

3. A display device according to claim 1, wherein said progressively variable display mark combination comprises a plurality of display marks selectively energizable depending on the remaining electric energy of the battery which is determined by said control means.

4. A display device according to claim 2, wherein said common display elements comprise LCDs.

5. A display device according to claim 3, wherein said display marks comprise LCDs.

6. A display device for displaying remaining electric energy of a battery in an electronic device having a member for storing predetermined data, said display device comprising:

a battery;

a time-constant circuit means, having at least a resistor and a capacitor selectively connected to said battery, for providing an output voltage representative of a voltage on said battery when subjected to said time-constant circuit, a rate of change of output voltage from said time-constant circuit being related to remaining electric energy of said battery;

switching means for selectively supplying said voltage on said battery to said time-constant circuit in response to a key stroke;

a reference voltage source;

means for comparing the output voltage from said time-constant circuit with said reference voltage;

control means for measuring a time interval from a time when the voltage of the battery is supplied to said time-constant circuit to a time when the output voltage of said time-constant circuit is greater than said reference voltage, for determining the remaining electric energy of the battery from the measured time interval; and display means having a common display area, for selectively displaying both information corresponding to the predetermined data and in response to said key stroke, a progressively variables display mark combination representative of the determined remaining electric energy of the battery.

7. A display device according to claim 6, wherein said output voltage from said time-constant circuit is taken from a juncture between resistor and said capacitor.

8. A display device according to claim 6, wherein said switching means is a transistor having its base connected to receive a control signal from the microcomputer in said control means in response to a detected voltage output from said battery.

9. A display device according to claim 8, wherein said microcomputer disables said transistor when said detected voltage output from said battery drops below a predetermined level.

10. A display device according to claim 9 wherein an output from said voltage comparison means is provided to said microcomputer.

11. A display device according to claim 2, wherein said common display elements switch from displaying the data stored in memory to displaying the progressively variable display mark combination representative of the determined remaining electric energy of the battery in response to the key stroke of a battery check button.

12. A display device according to claim 2, wherein,
each of said common display elements is configured in a figure 8 pattern having an upper portion and a lower portion, each portion forming a substantially square configuration, and the display means selectively displays the memory data in both the upper and lower portions of the display elements and selectively displays the progressively variable display mark combination in the lower portion of the display elements.

13. The display device according to claim 12, wherein the displayed memory data comprises time or radio frequency information.

14. A display device according to claim 6, wherein said display means comprises common display elements for selectively displaying the data stored in the memory and for selectively displaying the progressively variable display mark combination representative of the determined remaining electric energy of the battery.

15. A display device according to claim 14, wherein said common display elements switch from displaying the data stored in memory to displaying the progressively variable display mark combination representative of the determined remaining electric energy of the battery in response to the key stroke of a battery check button.

16. A display device according to claim 14, wherein,
each common display element is configured in a figure 8 pattern having an upper portion and a lower portion, each portion forming a substantially square configuration, and the display means selectively displays the memory data in both the upper and lower portions of the display elements and selectively displays the progressively variable display mark combination in the lower portion of the display elements.

17. The display device according to claim 16, wherein the displayed memory data comprises time or radio frequency information.

18. A display device for displaying the remaining electric energy of a battery in an electronic device and for displaying information stored in a memory of the electronic device, which comprises:

a display means having a common display area comprised of common display elements for selectively displaying the remaining electric energy of a battery and for selectively displaying the information stored in the memory, wherein, the display means selectively displays the memory information in each common display element and selectively displays in response to a key stroke of a battery check button, the remaining electric energy as a progressively variable display mark combination in some of the common display elements.

19. A display device according to claim 18, wherein, each common display element is configured in a figure 8 pattern having an upper and a lower portion, each portion forming a substantially square configuration, and the display means selectively displays the memory information in both the upper and lower portions of the display elements and selectively displays the remaining electric energy as a progressively variable display mark combination in the lower portion of the display elements.

20. The display device according to claim 19, wherein, said common display elements comprise LCDs and switch from displaying the information stored in memory to displaying the progressively variable display mark combination representative of the determined remaining electric energy of the battery in response to the key stroke of a battery check button.

21. A display device for displaying the remaining electric energy of a battery in an electronic device and for displaying information stored in a memory of the electronic device, which comprises:

a display means having a common display area comprised of common display elements for selectively displaying the remaining electric energy of a battery and for selectively displaying the information stored in the memory;

each common display element is configured in a figure 8 pattern having an upper portion and a lower portion, each forming a substantially square configuration; and the display means selectively displays the memory information in both the upper and lower portions of the display elements and selectively displays in response to a key stroke of a battery check button, the remaining electric energy as a progressively variable display mark combination in the upper portion or in the lower portion of the display elements.

22. The display device according to claim 21, wherein, said common display elements comprise LCDs and switch from displaying the information stored in memory to displaying the progressively variable display mark combination representative of the determined remaining electric energy of the battery in response to the key stroke of said battery check button.

* * * * *